United States Patent
Chen et al.

[11] Patent Number: 6,162,738
[45] Date of Patent: Dec. 19, 2000

[54] CLEANING COMPOSITIONS FOR HIGH DIELECTRIC STRUCTURES AND METHODS OF USING SAME

[75] Inventors: Gary Chen, Boise; Li Li, Meridian, both of Id.

[73] Assignee: Micron Technology, Inc., Boise, Id.

[21] Appl. No.: 09/144,857

[22] Filed: Sep. 1, 1998

[51] Int. Cl.[7] .............................................. H01L 21/302
[52] U.S. Cl. ........................ 438/745; 436/5; 510/175; 134/2
[58] Field of Search ................... 438/745; 436/5; 510/175; 134/2

[56] References Cited

U.S. PATENT DOCUMENTS

| | | | |
|---|---|---|---|
| 5,242,831 | 9/1993 | Oki | 436/5 |
| 5,292,673 | 3/1994 | Shinriki et al. | |
| 5,472,513 | 12/1995 | Shiramizu | 134/3 |
| 5,482,895 | 1/1996 | Hayashi et al. | |
| 5,601,656 | 2/1997 | Li | 134/2 |
| 5,672,577 | 9/1997 | Lee | 510/175 |
| 5,688,724 | 11/1997 | Yoon et al. | |
| 5,699,597 | 12/1997 | Nakamura et al. | |
| 5,763,300 | 6/1998 | Park et al. | |

*Primary Examiner*—Richard Elms
*Assistant Examiner*—Pho Luu
*Attorney, Agent, or Firm*—Mueting, Raasch & Gebhardt, P.A.

[57] ABSTRACT

A cleaning method includes providing a stack including at least a layer of $Ta_2O_5$ and a layer of conductive material. The stack includes a conductive etch residue on at least portions thereof. A dilute aqueous composition is provided including hydrochloric acid (HCl), hydrogen peroxide ($H_2O_2$), and deionized water ($H_2O$). The stack is exposed to the dilute aqueous composition to remove the conductive etch residue. The dilute aqueous composition may include a ratio of $H_2O:H_2O_2:HCl$ in a range of about 100:1:0.5 to about 100:10:5. A cleaning composition for use in the method includes a dilute aqueous composition including hydrochloric acid (HCl), hydrogen peroxide ($H_2O_2$), and deionized water ($H_2O$).

45 Claims, 3 Drawing Sheets

CLEANING COMPOSITIONS FOR HIGH DIELECTRIC STRUCTURES AND METHODS OF USING SAME

FIELD OF THE INVENTION

The present invention relates to methods of semiconductor fabrication. More particularly, the present invention pertains to the cleaning of structures including high dielectric constant materials.

BACKGROUND OF THE INVENTION

Tantalum oxide, specifically tantalum pentoxide ($Ta_2O_5$), is a desirable material for dielectrics in semiconductor devices because of its high dielectric constant of about 25. This high dielectric constant allows tantalum pentoxide devices to occupy a much smaller area than silicon dioxide devices, for example, such as when tantalum pentoxide dielectrics are used in the formation of capacitors in integrated circuit memory devices. Further, tantalum pentoxide dielectrics have also been used in gate insulating films for the formation of transistors in integrated circuit devices to achieve high transconductance.

Capacitors are becoming increasingly important in microelectronic devices. For example, microelectronic capacitors are widely used in integrated circuit memory devices, such as dynamic random access memory (DRAM) device, static random access memory (SRAM) devices, etc. As the integration density of memory devices continues to increase, memory devices having larger per-unit area capacitance are often needed to compensate for the reduced memory device size. Use of high dielectric constant materials, such as tantalum pentoxide, has been used to increase per-unit area capacitance to obtain larger capacitance with reduced capacitor size.

As is well known, a capacitor generally includes a first conductive electrode and a second conductive electrode with a dielectric material therebetween. For example, a high dielectric material such as tantalum pentoxide may be positioned between two conductive electrodes formed of materials, such as titanium nitride, polysilicon, platinum, or any other suitable conductive electrode material.

During formation of high dielectric constant structures, such as capacitor structures, typically dry etching is performed to etch layers of the high dielectric material and the conductive electrode materials to form a capacitor structure. The dry etching of such layers generally results in a conductive etch residue which must be removed prior to subsequent processing. For example, such conductive etch residue may be a polymeric residue including tantalum, titanium, chlorine, and carbon therein when layers such as titanium nitride and tantalum pentoxide are patterned using photoresist and a chlorine containing plasma etchant.

If the conductive etch residue is not effectively removed, various operating failures may occur. For example, such conductive etch residue may cause a short between the first and second electrodes of a capacitor structure.

Various wet or aqueous cleaning solutions are available for cleaning semiconductor-based structures. For example, an SC1 clean, an SC2 clean, a piranha clean, a buffered oxide etch solution, and other fluorine-based wet chemistries have been used for cleaning residues from structures. However, such cleaning solutions are ineffective for cleaning conductive etch residues for high dielectric structures. Such cleaning solutions fail to clean the conductive etch residues without attacking the high dielectric structures, such as capacitor structures.

SUMMARY OF THE INVENTION

There is a need for cleaning compositions and methods of using such cleaning compositions in the fabrication of high dielectric structures for removal of conductive etch residues without attacking the high dielectric structures. In accordance with the present invention, a dilute aqueous cleaning composition and methods of using such a dilute aqueous cleaning composition are described.

A cleaning method in a semiconductor fabrication process according to the present invention includes providing a stack including at least a layer of $Ta_2O_5$ and a layer of conductive material. The stack includes a conductive etch residue on at least portions thereof. A dilute aqueous composition is provided consisting essentially of hydrochloric acid (HCl), hydrogen peroxide ($H_2O_2$), and deionized water ($H_2O$). The stack is exposed to the dilute aqueous composition to remove the conductive etch residue.

In one embodiment of the method, the dilute aqueous composition includes a ratio of $H_2O:H_2O_2:HCl$ in a range of about 100:1:0.5 to about 100:10:5. More preferably, the dilute aqueous composition includes a ratio of $H_2O:H_2O_2:HCl$ of about 100:2:1.

In another embodiment of the method, provision of the stack includes providing a first conductive layer, providing a second conductive layer, providing a layer of $Ta_2O_5$ between the first and second conductive layers, and etching the first conductive layer, the second conductive layer and the layer of $Ta_2O_5$ to form the stack with the conductive etch residue resulting on at least portions thereof.

In another embodiment of the method, the first conductive layer may be a layer of at least platinum. Further, the second conductive layer may include a layer of at least one of a metal nitride and a metal silicide, such as titanium nitride.

In another cleaning method in a semiconductor fabrication process according to the present invention, the method includes providing a stack including at least a layer of $Ta_2O_5$ and a layer of conductive material. The stack includes a conductive etch residue on at least portions thereof. The method further includes providing a dilute aqueous composition comprising hydrochloric acid (HCl), hydrogen peroxide ($H_2O_2$), and deionized water ($H_2O$). The dilute aqueous composition includes a ratio of $H_2O:H_2O_2:HCl$ in a range of about 100:1:0.5 to about 100:10:5. The stack is exposed to the dilute aqueous composition to remove the conductive etch residue.

A cleaning composition for use in integrated circuit fabrication according to the present in invention consists essentially of a dilute aqueous composition. The dilute aqueous composition consists essentially of hydrochloric acid (HCl), hydrogen peroxide ($H_2O_2$), and deionized water ($H_2O$).

Another cleaning composition for use in integrated circuit fabrication according to the present invention comprises a dilute aqueous composition, wherein the dilute aqueous composition includes hydrochloric acid (HCl), hydrogen peroxide ($H_2O_2$), and deionized water ($H_2O$). Further, the dilute aqueous composition includes a ratio of $H_2O:H_2O_2:HCl$ in a range of about 100:1:0.5 to about 100:10:5.

A high dielectric structure cleaning method for use in integrated circuit fabrication according to the present invention includes providing a structure including a first region of at least platinum and a second region of at least $Ta_2O_5$, e.g, a capacitor structure. The structure includes a conductive etch residue on at least portions thereof. The structure is exposed to a dilute aqueous composition consisting essentially of hydrochloric acid (HCl), hydrogen peroxide ($H_2O_2$), and deionized water ($H_2O$) to remove the conductive etch residue.

In another method of the present invention, a high dielectric capacitor structure cleaning method for use in integrated circuit fabrication is described. The method includes providing a capacitor structure including a first electrode layer, a dielectric layer of at least $Ta_2O_5$ formed on at least a portion of the first electrode layer, and a second electrode layer formed on the dielectric layer. The capacitor structure includes a conductive etch residue on at least portions thereof. A dilute aqueous composition consisting essentially of hydrochloric acid (HCl), hydrogen peroxide ($H_2O_2$), and deionized water ($H_2O$) is provided. The capacitor structure is exposed to the dilute aqueous composition to remove the conductive etch residue. A portion of the second electrode layer is also removed.

In other embodiments of the method, removing a portion of the second electrode layer is performed at a rate in a range of about 4 Å/minute to about 2 Å/minute and/or the second electrode layer is formed of titanium nitride.

In another high dielectric capacitor structure cleaning method according to the present invention, the method includes providing a capacitor structure including a first electrode layer formed of platinum, a dielectric layer of at least $Ta_2O_5$ formed on at least a portion of the first electrode layer, and a second electrode layer of titanium nitride formed on the dielectric layer. The capacitor structure includes a conductive etch residue on at least portions thereof. A dilute aqueous composition consisting essentially of hydrochloric acid (HCl), hydrogen peroxide ($H_2O_2$), and deionized water ($H_2O$) is provided and the capacitor structure is exposed to the dilute aqueous composition to remove the conductive etch residue.

Yet further, a cleaning method for cleaning a stack including at least a layer of $Ta_2O_5$ and a layer of conductive material is provided. The stack includes a conductive etch residue on at least portions thereof. A dilute aqueous composition consisting essentially of a mineral acid, hydrogen peroxide ($H_2O_2$), and deionized water ($H_2O$) is provided. The dilute aqueous composition includes a ratio of $H_2O:H_2O_2$:mineral acid in a range of about 100:1:0.5 to about 100:10:5. The stack is exposed to the dilute aqueous composition to remove the conductive etch residue.

DETAILED DESCRIPTION OF THE EMBODIMENTS

The present invention shall be generally described with reference to FIGS. 1–3. Thereafter, the use of the present invention for cleaning illustrative high dielectric structures shall be described with reference to FIGS. 4–5. With the description as provided below, it would be readily apparent to one skilled in the art that various processes described with respect to the figures may be utilized in various configurations and for various applications. For example, the present invention may be used in the formation of capacitors, word lines, bit lines, gate electrodes, or any application which may use a high dielectric constant material, such as tantalum pentoxide. Further, for example, the present invention may be particularly beneficial in the fabrication of capacitor structures of a DRAM, an SRAM or other memory devices.

In this application, substrate assembly refers to either a semiconductor substrate such as the base semiconductor layer, e.g., the lowest layer of a silicon material on a wafer, or a silicon layer deposited on another material, such as silicon on sapphire, or a semiconductor substrate having one or more layers or structures formed thereon or regions formed therein. When reference is made to a substrate assembly in the following description, various process steps may have been previously used to form or define regions, junctions, various structures or features, and openings.

Figure 1:
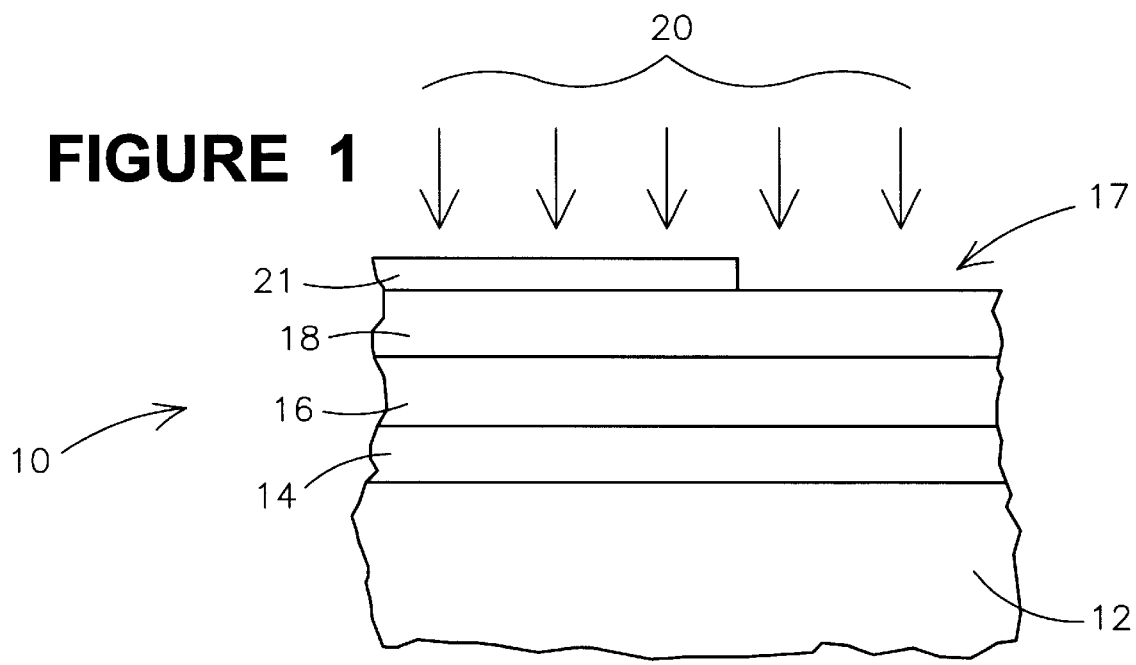
FIGS. 1–3 are illustrative diagrams showing a cleaning process for removal of conductive etch residues from high dielectric structures.
Figure 2:
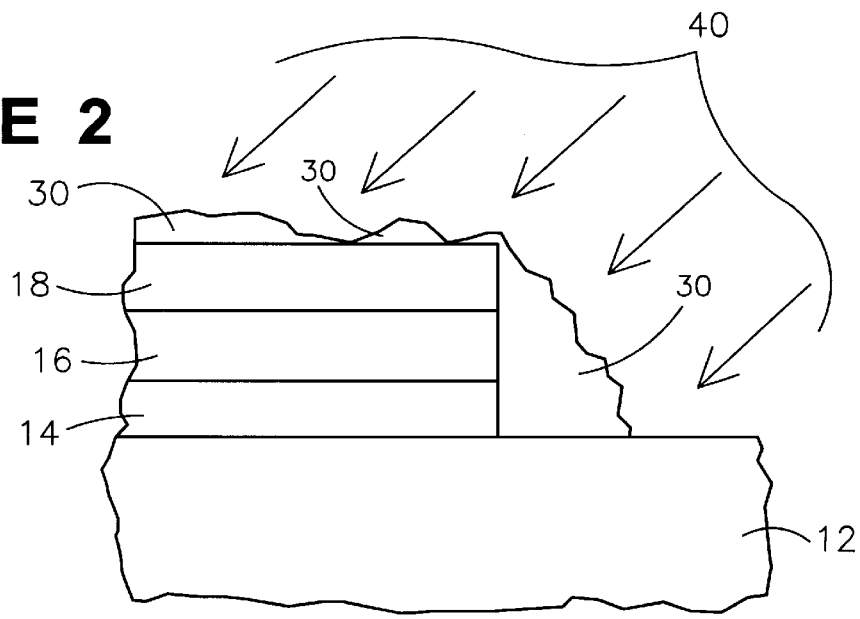

FIG. 1 generally illustrates a high dielectric structure 10 for which a dilute aqueous cleaning composition 40 (as shown in FIG. 2) according to the present invention is beneficial. The high dielectric structure 10 includes a substrate assembly 12 and several layers formed thereon. According to the present invention, the layers formed on the substrate assembly 12 include at least a high dielectric constant material layer 16 and at least one conductive material layer. According to the present invention, either one or both of the layers 14 and 18 may be formed of conductive material depending upon the structure being formed. For example, layer 14 and 18 may both be formed of conductive material such as in the formation of a capacitor structure or just layer 18 may be formed of a conductive material with the layer 14 being formed of an insulating material such as in the formation of a gate structure of a transistor. Further, the stack of layers including at least high dielectric constant material layer 16 and at least one conductive material layer 18 and/or 14 may include one or more additional layers.

The stack of layers including at least high dielectric constant material layer 16 and at least one conductive material layer 18 and/or 14 is generally patterned using conventional photolithography techniques such as with the use of a resist material 21 and a dry etchant 20 using a suitable dry etching technique. The resultant patterned stack including at least high dielectric constant material layer 16 and at least one conductive material layer 18 and/or 14 is shown in FIG. 2 and shall be described in further detail below.

The high dielectric constant material layer 16 may be formed of any high dielectric constant material. As used herein, a high dielectric constant material includes any material having a dielectric constant greater than about 7.9. For example, such high dielectric constant materials may include tantalum pentoxide ($Ta_2O_5$), $Ba_xSr_{(1-x)}TiO_3$ [BST], $BaTiO_3$, $SrTiO_3$, $PbTiO_3$, $Pb(Zr,Ti)O_3$ [PZT], $(Pb,La)(Zr,Ti)O_3$ [PLZT], $(Pb,La)TiO_3$ [PLT], $KNO_3$, and $LiNbO_3$. Preferably, according to the present invention, the high dielectric constant material 16 is tantalum pentoxide.

Preferably, the layer 18 is a conductive material layer formed of any conductive material suitable or desired for the particular application in which the stack, including at least high dielectric constant material layer 16 and at least one conductive material layer 18 and/or 14, is used. For example, the conductive material layer 18 may be formed of a metal (e.g., platinum, aluminum, titanium, tungsten), polysilicon, a metal silicide (e.g., titanium silicide, tungsten silicide, ruthenium silicide), a metal nitride (e.g., titanium nitride, tungsten nitride), or any other conductive material suitable for the desired use of the stack. Preferably, according to the present invention, the conductive material layer 18 is a metal nitride layer or a metal silicide layer. Further, more preferably, the conductive material layer 18 is a metal nitride layer. Yet further, the conductive material layer 18 is titanium nitride. For example, titanium nitride is a material that is advantageously used as the top electrode for high dielectric capacitor structures.

The layer 14 is formed of a suitable material according to the use of the stack in particular applications or structures. For example, if the stack of layers 14, 16, and 18 is used to form a capacitor structure, then layer 14 is a conductive material layer for use in forming the bottom electrode of the capacitor structure. The high dielectric constant material layer 16 is the dielectric layer of the capacitor structure and conductive material layer 18 is used to form the second or top electrode of the capacitor structure. For example, when layer 14 is a conductive material layer, the layer 14 may be formed of a metal (e.g., platinum, aluminum, titanium, tungsten), polysilicon, a metal silicide (e.g., titanium silicide, tungsten silicide, ruthenium silicide), a metal nitride (e.g., titanium nitride, tungsten nitride), or any other suitable conductive material. Preferably, according to the present invention, when layer 14 is a conductive material layer, the layer 14 is formed of platinum. In other words, a platinum layer is used to form the bottom electrode for the capacitor structure.

In other applications, the layer 14 may be formed of other materials. For example, if the stack of layers including at least high dielectric constant material layer 16 and at least one conductive material layer 18 and/or 14, is to be used for forming a transistor gate structure, then layer 14 may be a pad oxide layer. In such a case, layer 16 is a high dielectric constant material layer such as tantalum pentoxide with layer 18 being a conductive material layer such as polycide.

As described above, one skilled in the art will recognize that preferable combinations of stacks as used herein include a stack of at least titanium nitride and tantalum pentoxide and a stack including at least tantalum pentoxide and platinum. Further, one preferred stack would include a tantalum pentoxide layer between a titanium nitride layer and a platinum layer.

One skilled in the art shall also recognize that any of the layers 14, 16 and 18 may be formed of one or more materials or one or more layers. For example, layer 18 may be a polycide layer including a polysilicon layer and a metal silicide layer. Further, for example, the layers 14 and/or 18 used in the formation of capacitor electrodes may be multilayer electrodes and include more than a layer of platinum, or a layer of titanium nitride. Different layers may be required for barrier functions or other requirements in the formation of a capacitor structure. Further, the high dielectric constant material layer 16 may be formed of one or more high dielectric constant materials.

Yet further, one skilled in the art will recognize that the layers formed upon one another may take one of various different configurations. For example, the bottom electrode layer 14 for a capacitor structure may be formed in an opening, e.g., a trench, a container, etc., with the other layers formed thereover. Therefore, the general illustration of FIG. 1 is not limited to the generally horizontal layer construction as shown therein. Further, the various layers as described herein may be formed according to any particular suitable technique, such as sputtering, chemical vapor deposition, growth processes, such as growing silicon dioxide as an oxide layer, etc. The present invention is not limited to any particular technique of forming such layers.

Upon provision of the stack of layers shown in FIG. 1, including at least a high dielectric constant material layer 16, preferably tantalum pentoxide layer, and at least one conductive material layer 18 and/or 14, the stack is patterned as described above using conventional photolithography methods. For example, the photoresist layer 21 is formed on the stack and patterned as is well known to one skilled in the art resulting in the patterned photoresist layer as shown in FIG. 1 defining exposed areas 17 of the stack. The stack of layers is then etched in the exposed areas 17, resulting in a structure as shown in FIG. 2. For example, the etchant used to pattern the stack may vary depending upon the materials of the stack. For example, when patterning metal layers, such as aluminum, titanium nitride, or high dielectric layers such as tantalum pentoxide, chlorine-containing etchants are typically used. For example, such chlorine-containing etchants may include $Cl_2$, $BCl_3$, $CCl_4$, $SiCl_4$, and combinations thereof. Further, for example, other etchants such as argon, $CF_4$, $CHF_3$, or any other fluorocarbon based chemistries, may also be used to pattern the stack. Generally, the dry etch is a plasma etch for isotropically etching the stack. However, the exact nature of the etchant and the process using the etchant is tangential to the fact that with the use of a dry etchant, a polymeric conductive etch residue 30, as shown in FIG. 2, results on at least portions of the structure etched from the stack of layers.

Furthermore, as shown in FIG. 2, patterned photoresist layer 21 is removed prior to subsequent processing. After patterning or etching the stack of layers, an oxygen ash is commonly used, or any suitable method (wet or dry) may be used, to remove the photoresist layer 21, as is well known to one skilled in the art. For example, a typical oxygen ash includes heating the structure in a furnace having a temperature of about 200–300° C. in the presence of an oxygen-containing plasma. Other examples of photoresist removal include heating the structure in the presence of an ozone-containing environment or wet cleaning the structure using organic strippers.

The conductive etch residue 30 will depend on the constituent elements of the stack of layers. The chemical nature of the conductive etch residue 30 will vary. For example, if the high dielectric constant material used is tantalum pentoxide and the layer 18 is formed of titanium nitride, the conductive etch residue 30 may contain tantalum and titanium components therein. Further, with the use of a chlorine-containing etchant, the conductive etch residue may include metal chlorides. Generally, the conductive etch residue 30 is polymeric in nature and includes elements such as components of the metals etched during the dry etch process and components of the photoresist removed.

The conductive etch residue 30 must be removed prior to subsequent processing of the patterned stack. The present invention describes a cleaning composition with suitable concentrations of a mineral acid, such as hydrochloric acid, hydrogen peroxide, and deionized water. The cleaning composition removes the conductive etch residue 30 without fatally attacking the patterned stack. In particular, the cleaning process and composition according to the present invention is particularly beneficial for cleaning a stack including at least titanium nitride and tantalum pentoxide and a stack including at least tantalum pentoxide and platinum. Particularly, the cleaning composition is beneficial in removing conductive etch residues from such particular structures because the cleaning composition selectively removes the conductive etch residue 30 with substantially no etching of platinum and with etching of titanium nitride at a rate less than 4 angstroms per minute. The etching of the titanium nitride at such a slow rate ensures cleaning of the titanium nitride surface prior to subsequent processing, particularly beneficial when the titanium nitride is used as the top electrode of a capacitor structure.

Removal of the conductive etch residue 30 is necessary to prevent device failures. For example, the conductive etch residue 30, if not removed, may short the layers 14 and 18 such as when the layers are conductive material layers representative of first and second electrodes of a capacitor structure. Such shorting of the electrodes would result in failure of the device.

In accordance with the present invention, the conductive etch residue 30 is removed using a dilute aqueous cleaning composition including a mineral acid and hydrogen peroxide. Suitable mineral acids for the cleaning composition include but are not limited to hydrochloric acid (HCl), nitric acid ($HNO_3$), sulfuric acid ($H_2SO_4$), or phosphoric acid ($H_3PO_4$). However, preferably, the mineral acid used in accordance with the present invention is hydrochloric acid. Mineral acids are commercially available as concentrated solutions (X) which then typically are diluted to a desired concentration ($H_2O:X$). For example, commercially available concentrated acids are available as follows: HCl is 37% by weight in deionized water; $HNO_3$ is 70% by weight in deionized water; and $H_2SO_4$ is 96% by weight in deionized water. Concentrations of cleaning compositions described herein are given based on the commercially available solutions. For example, if the cleaning composition has a concentration of 30% HCl, then the solution includes 30% by weight of the commercially available HCl solution.

Hydrogen peroxide is used in the dilute aqueous cleaning composition for its benefits in removal of organic parts of the conductive etch residue 30. Hydrogen peroxide ($H_2O_2$) is commercially available as a concentrated solution, approximately 29% by weight in deionized water.

The concentrated solutions of a mineral acid and hydrogen peroxide are diluted by volume in deionized water in desired proportions according to the following ratios to provide the cleaning composition according to the present invention. Preferably, the cleaning composition includes a ratio of $H_2O:H_2O_2:HCl$ in the range of about 100:10:5 to about 100:1:0.5. More preferably, the cleaning composition has a $H_2O:H_2O_2:HCl$ ratio of about 100:2:1. The above ranges for the ratios of the cleaning composition are particularly applicable to the use of hydrochloric acid and hydrogen peroxide, but appear to be equally applicable to cleaning compositions using other mineral acids.

Deionized water for the practice of this invention is formed by standard ion exchange and/or distillation techniques, as are known to one of skill in the art. A suitable deionized water used in the production of integrated circuit components typically exhibits a conductivity ranging from about 12 to 18 megohms.

Generally, to clean the conductive etch residue 30 from the patterned stack of layers including at least high dielectric constant material layer 16 and at least one conductive material layer 18 and/or 14, the cleaning method includes immersing the structure including the stack in a tank of the cleaning composition 40 as represented generally by the arrows in FIG. 2. Although immersion in the cleaning composition 40 is preferred, the cleaning composition 40 may also be sprayed onto the wafers being cleaned or may be introduced for contact with the wafer in any other manner.

Generally, the cleaning process is performed at room temperature. However, other temperatures may be used with a preferred range being from about room temperature to about 75° C.

Generally, removal of the conductive etch residue 30 is a time consuming process. Typically, the cleaning process may take up to about 15 minutes to complete. Such a cleaning process is generally unable to remove the conductive etch residue 30 in less than about 5 minutes. For this reason, cleaning composition 40 must be selected such that removal of material from the stack of layers 14, 16, 18 by the cleaning composition 40 is substantially nonexistent. For example, the cleaning composition 40 according to the present invention does not attack a platinum layer, i.e., leaving the platinum layer substantially entirely intact.

The conductive etch residue 30 may not be continuous in nature on the upper surface 19 of layer 18. Therefore, such as when layer 18 is formed of titanium nitride, the etch rate of titanium nitride by the cleaning composition 40 must be kept to a minimum so that too much titanium nitride is not removed before the conductive etch residue 30 is removed. Generally, in a vertical direction, the conductive etch residue is typically continuous.

To control the etching of a layer 18 formed of titanium nitride, the cleaning composition 40 is selected such that etching of titanium nitride occurs at less than 4 angstroms per minute and preferably less than 2 angstroms per minute. At such rates, during a process which usually takes between about 5 minutes and about 15 minutes, less than 60 angstroms of titanium nitride is removed. Preferably, less than 40 angstroms of a titanium nitride layer, such as a titanium nitride layer used as a top electrode in a high dielectric capacitor structure, is removed during removal of the conductive etch residue 30. However, it is desirable that some etching of the titanium nitride occur to regenerate the surface of the titanium nitride for subsequent processing.

After immersion in a tank or container of the cleaning composition 40, the structure being cleaned is removed and subjected to a drying technique. For example, an isopropyl alcohol vapor dry may be used to dry the structure upon removal from the cleaning composition 40.

One skilled in the art will recognize that in addition to immersion in the tank of cleaning composition 40, that other techniques may be used to enhance the cleaning of the structure. For example, megasonic energy, ultrasonic energy, or other agitation techniques may be used in conjunction with the cleaning composition in accordance with the present invention.

Figure 3:
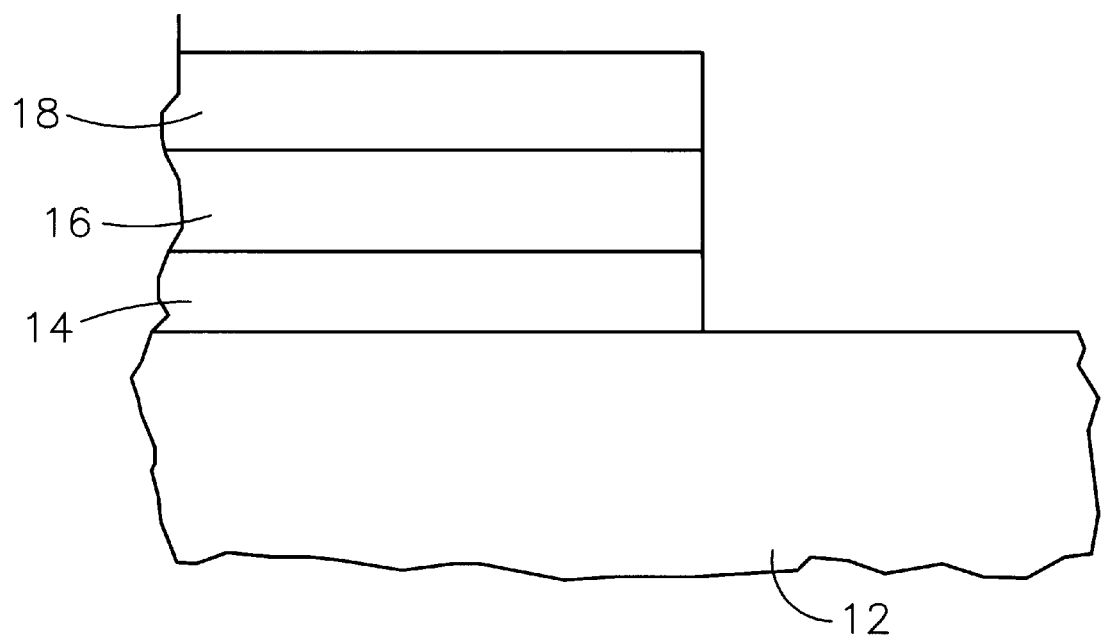

Upon removal from immersion in a tank of cleaning composition 40, the cleaned resultant structure is shown in FIG. 3. As shown therein, the conductive etch residue 30 is completely removed.

Figure 4:
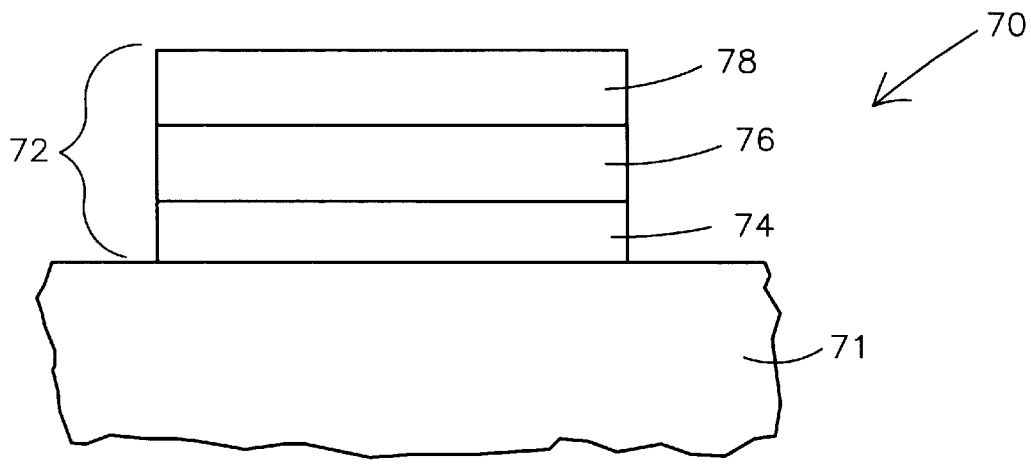
FIG. 4 is an illustrative diagram showing a high dielectric capacitor structure cleaned according to the present invention.
Figure 5:
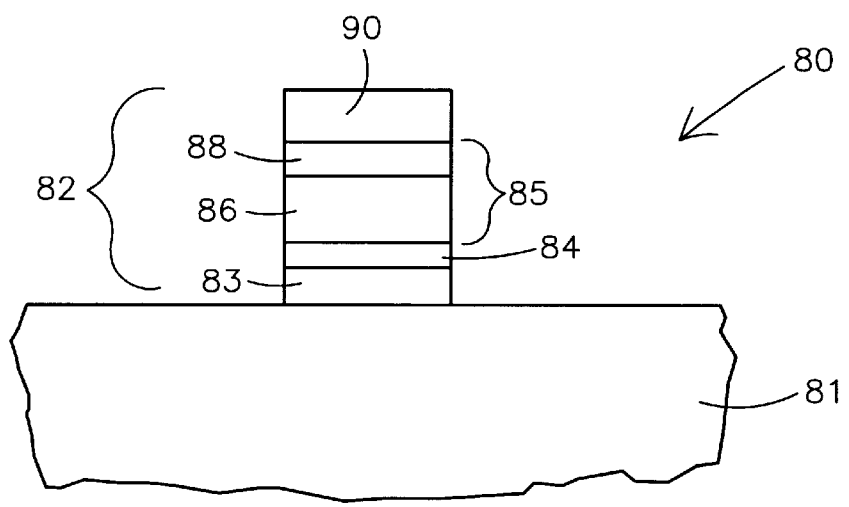
FIG. 5 is an illustrative diagram showing a portion of a gate structure for a transistor cleaned according to the present invention.

FIGS. 4 and 5 illustrate two embodiments of structures which may be cleaned using the cleaning composition 40 according to the present invention. One skilled in the art will recognize that other structures including but not limited to a stack of at least platinum and tantalum pentoxide; a stack of at least a conductive material and tantalum pentoxide, such as titanium nitride and tantalum pentoxide; and a stack of platinum, tantalum pentoxide, and titanium nitride, may be cleaned advantageously according to the present invention. FIG. 4 illustrates a structure 70 including a capacitor structure 72 formed on a substrate assembly 71 and cleaned according to the present invention. FIG. 5 illustrates a structure 80 including a transistor gate structure 82 formed on a semiconductor substrate 81 and cleaned according to the present invention.

As shown in FIG. 4, capacitor structure 72 includes a first electrode layer 74 and a second electrode layer 78. Further, the capacitor structure 72 includes a high dielectric material layer 76 between the first and second electrode layers 74 and 78. In one embodiment of the present invention using the cleaning composition 40 according to the present invention, first electrode layer 74 is formed of platinum and high dielectric material constant layer 76 is formed of tantalum pentoxide. The top electrode or second electrode 78 may be formed of any other conductive material, but preferably is formed of titanium nitride.

In another embodiment of a capacitor structure 72 cleaned in accordance with the present invention, the high dielectric material layer 76 is formed of tantalum pentoxide and the second electrode layer 78 is formed of titanium nitride. The first electrode or bottom electrode layer 74 may be formed of any suitable conductive electrode material, but is preferably formed of platinum.

The cleaning composition 40 is advantageously used to clean the capacitor structure 72, which may include a titanium nitride layer 78, a tantalum pentoxide layer 76, and a platinum layer 74. The titanium nitride layer 78 would only be slightly etched at a rate less than 4 angstroms per minute with the tantalum pentoxide layer 76 and the platinum layer 74 being left intact.

One skilled in the art will recognize that in addition to these two illustrative embodiments, that, as previously indicated, the layers may be formed of additional materials and/or one or more layers, such as a multi-layer electrode. One skilled in the art will also recognize that various configurations of capacitor structures other than the generally planar structure shown in FIG. 4 may be constructed using a cleaning composition according to the present invention, e.g., a container capacitor structure, a stacked capacitor structure, etc.

As shown in FIG. 5, the transistor gate structure 82 includes a pad oxide layer 83 formed on semiconductor substrate 81. A tantalum pentoxide layer 84 is formed over the pad oxide layer 83. Further, the gate structure 82 includes a conductive region 85, such as a polysilicon region 86 and a metal silicide region 88. In addition, the structure 82 includes an oxide region 90 to complete the patterned gate structure 82. Because the dry etching performed to create the structure 82 results in a conductive etch residue, the cleaning composition 40 according to the present invention is beneficial in removing such conductive etch residue without attacking the gate structure 82.

The following example is given to represent the unexpected results of using a cleaning composition 40 according to the present invention when other cleaning compositions typically used in cleaning are ineffective.

EXAMPLE 1

Three wafers were fabricated with capacitor structures. The capacitor structures formed included a platinum layer having a thickness of about 500 Å, a tantalum pentoxide layer formed over the platinum layer having a thickness of about 70 Å, and a titanium nitride layer formed over the tantalum pentoxide layer having a thickness of about 400 Å. The stack of layers were patterned using a photoresist and etched using a dry plasma etch. The dry plasma etch was performed in a MERIG reaction chamber available under the trade designation AME 5000 from Applied Materials, Inc. A flow of 50 sccm of $Cl_2$ was provided into the chamber and the etch was performed at the following parameters: a plasma power of about 250 watts, a pressure of 50 millitorr, and a temperature of 50° C.

After the dry plasma etch and after removal of the photoresist by an oxygen ash process, a post-conductive etch residue having at least tantalum, titanium, chlorine, and carbon components was present on each wafer. The first wafer was then immersed into a tank having a cleaning solution of 20:1 of $H_2O:HCl$. The second wafer was immersed in a tank including a cleaning solution of $H_3PO_4$ at a ratio of 20:1. The third wafer was immersed in a cleaning composition according to the present invention having a composition of $H_2O:H_2O_2:HCl$ at a ratio of 100:2:1. All of the wafers were cleaned at a temperature of about 30° C. for about 10 minutes.

After immersion in the cleaning solutions, the wafers were removed and dried in an isopropyl alcohol vapor dry. Thereafter, the wafers were subjected to electrical resistance probing as described below.

To check the effectiveness of the cleaning process and the cleaning composition, the electrical resistance was probed between the top and bottom electrode, or, in other words, between the titanium nitride regions and platinum regions of the stack. If the conductive etch residue present on the wafer was effectively cleaned, the resistance between the two electrodes would be infinity.

The probe results from the tests showed that the first two cleaning compositions of $H_2O:HCl$ at a ratio of 20:1 and $H_2O:H_3PO_4$ at a ratio of 20:1 resulted in shorts, indicating that conductive etch residue was still present after cleaning using such solutions. The wafers subjected to the cleaning process using the cleaning composition of $H_2O:H_2O_2:HCl$ at a ratio of 100:2:1 gave a resistance of infinity, indicating conductive etch residue was effectively removed preventing the possibility of a short between the two electrodes, i.e., the titanium nitride and the platinum.

It is to be understood that the above description is intended to be illustrative, and not restrictive. Many other embodiments will be apparent to those skilled in the art upon reviewing the above description. For example, the dilute aqueous cleaning composition of the present invention is particularly useful for various high dielectric structures which need to be cleaned during fabrication processes. The scope of the invention should, therefore, be determined with reference to the appended claims, along with the full scope of equivalents to which such claims are entitled.

What is claimed is:

1. A cleaning method in a semiconductor fabrication process, the method comprising:

providing a stack including at least a layer of $Ta_2O_5$ and a layer of conductive material, wherein the stack includes a conductive etch residue on at least portions thereof;

providing a dilute aqueous composition consisting essentially of hydrochloric acid (HCl), hydrogen peroxide ($H_2O_2$), and deionized water ($H_2O$); and exposing the stack to the dilute aqueous composition to remove the conductive etch residue.

2. The method of claim 1, wherein the dilute aqueous composition includes a ratio of $H_2O:H_2O_2:HCl$ in a range of about 100:1:0.5 to about 100:10:5.

3. The method of claim 2, wherein the dilute aqueous composition includes a ratio of $H_2O:H_2O_2:HCl$ of about 100:2:1.

4. The method of claim 2, wherein the exposing step includes exposing the stack to the dilute aqueous composition at a temperature in a range of about room temperature to about 75 degrees Celsius.

5. The method of claim 4, wherein the exposing step includes exposing the stack to the dilute aqueous composition at a temperature of about 30 degrees Celsius.

6. The method of claim 1, wherein providing the stack includes:
provided a first conductive layer;
providing a second conductive layer;
providing a layer of $Ta_2O_5$ between the first and second conductive layers; and
etching the first conductive layer, the second conductive layer and the layer of $Ta_2O_5$ to form the stack with the conductive etch residue resulting on at least portions thereof.

7. The method of claim 6, wherein providing the first conductive layer includes providing a layer of at least platinum.

8. The method of claim 6, wherein providing the second conductive layer includes providing a layer of at least one of a metal nitride and a metal silicide.

9. The method of claim 8, wherein providing the second conductive layer includes providing a layer of at least titanium nitride.

10. A cleaning method in a semiconductor fabrication process, comprising:
providing a stack including at least a layer of $Ta_2O_5$ and a layer of conductive material, wherein the stack includes a conductive etch residue on at least portions thereof;
providing a dilute aqueous composition comprising hydrochloric acid (HCl), hydrogen peroxide ($H_2O_2$), and deionized water ($H_2O$), wherein the dilute aqueous composition includes a ratio of $H_2O:H_2O_2:HCl$ in a range of about 100:1:0.5 to about 100:10:5; and
exposing the stack to the dilute aqueous composition to remove the conductive etch residue.

11. The method of claim 10, wherein the dilute aqueous composition includes a ratio of $H_2O:H_2O_2:HCl$ of about 100:2:1.

12. The method of claim 10, wherein providing the stack includes:
providing a first conductive layer;
providing a second conductive layer;
providing a layer of $Ta_2O_5$ between the first and second conductive layers; and
etching the first conductive layer, the second conductive layer and the layer of $Ta_2O_5$ to form the stack with the conductive etch residues resulting on at least portions thereof.

13. The method of claim 12, wherein providing the first conductive layer includes providing at least a layer of platinum.

14. The method of claim 12, wherein providing the second conductive layer includes providing a layer of at least one of a metal nitride and a metal silicide.

15. The method of claim 14, wherein providing the second conductive layer includes providing at least a layer of titanium nitride.

16. A cleaning composition for use in integrated circuit fabrication, the cleaning composition consisting essentially of a dilute aqueous composition of hydrochloric acid (HCl), hydrogen peroxide ($H_2O_2$), and deionized water ($H_2O$), wherein the dilute aqueous composition includes a ratio of $H_2O:H_2O_2:HCl$ in a range of about 100:1:0.5 to about 100:10:5.

17. The cleaning composition of claim 16, wherein the dilute aqueous composition includes a ratio of $H_2O:H_2O_2:HCl$ of about 100:2:1.

18. A cleaning composition for use in integrated circuit fabrication, the cleaning composition comprising a dilute aqueous composition, the dilute aqueous composition including hydrochloric acid (HCl), hydrogen peroxide ($H_2O_2$), and deionized water ($H_2O$), wherein the dilute aqueous composition includes a ratio of $H_2O:H_2O_2:HCl$ in a range of about 100:1:0.5 to about 100:10:5.

19. The cleaning composition of claim 18, wherein the dilute aqueous composition includes a ratio of $H_2O:H_2O_2:HCl$ of about 100:2:1.

20. A high dielectric structure cleaning method for use in integrated circuit fabrication, the method comprising:
providing a structure including a first region of at least platinum and a second region of at least $Ta_2O_5$, wherein the structure includes a conductive etch residue on at least portions thereof;
providing a dilute aqueous composition consisting essentially of hydrochloric acid (HCl), hydrogen peroxide ($H_2O_2$), and deionized water ($H_2O$); and
exposing the structure to the dilute aqueous composition to remove the conductive etch residue.

21. The method of claim 20, wherein the dilute aqueous composition includes a ratio of $H_2O:H_2O_2:HCl$ in a range of about 100:1:0.5 to about 100:10:5.

22. The method of claim 21, wherein the dilute aqueous composition includes a ratio of $H_2O:H_2O_2:HCl$ of about 100:2:1.

23. The method of claim 20, wherein the structure is a capacitor structure, and further wherein the capacitor structure includes:
a first electrode layer including the first region of at least platinum;
a dielectric layer including the second region of at least $Ta_2O_5$ formed on at least a portion of the first electrode layer; and
a second electrode layer formed on the dielectric layer.

24. The method of claim 23, wherein exposing the structure to the dilute aqueous composition to remove the conductive etch residue includes removing a portion of the second electrode layer.

25. The method of claim 24, wherein removing a portion of the second electrode layer is performed at a rate in the range of about 4 Å/minute to about 2 Å/minute.

26. The method of claim 23, wherein the second electrode layer is formed of a metal nitride.

27. The method of claim 26, wherein second electrode layer is formed of titanium nitride.

28. The method of claim 23, wherein the dilute aqueous composition includes a ratio of $H_2O:H_2O_2:HCl$ in a range of about 100:1:0.5 to about 100:10:5.

29. A high dielectric capacitor structure cleaning method for use in integrated circuit fabrication, the method comprising:
providing a capacitor structure including a first electrode layer, a dielectric layer of at least $Ta_2O_5$ formed on at least a portion of the first electrode layer, and a second electrode layer formed on the dielectric layer, wherein the capacitor structure includes a conductive etch residue on at least portions thereof;
providing a dilute aqueous composition consisting essentially of hydrochloric acid (HCl), hydrogen peroxide ($H_2O_2$), and deionized water ($H_2O$); and
exposing the capacitor structure to the dilute aqueous composition to remove the conductive etch residue, wherein a portion of the second electrode layer is also removed.

30. The method of claim 29, wherein removing a portion of the second electrode layer is performed at a rate in a range of about 4 Å/minute to about 2 Å/minute.

31. The method of claim 29, wherein the dilute aqueous composition includes a ratio of $H_2O:H_2O_2:HCl$ in a range of about 100:1:0.5 to about 100:10:5.

32. The method of claim 31, wherein the dilute aqueous composition includes a ratio of $H_2O:H_2O_2:HCl$ of about 100:2:1.

33. The method of claim 29, wherein the first electrode layer is formed of at least platinum and the second electrode layer is formed of at least a metal nitride.

34. The method of claim 33, wherein second electrode layer is formed of titanium nitride.

35. A high dielectric capacitor structure cleaning method for use in integrated circuit fabrication, the method comprising:

provideing a capacitor structure including a first electrode layer formed of platinum, a dielectric layer of at least $Ta_2O_5$ formed on at least a portion of the first electrode layer, and a second electrode layer of titanium nitride formed on the dielectric layer, wherein the capacitor structure includes a conductive etch residue on at least portions thereof;

providing a dilute aqueous composition consisting essentially of hydrochloric acid (HCl), hydrogen peroxide ($H_2O_2$), and deionized water ($H_2O$); and exposing the capacitor structure to the dilute aqueous composition to remove the conductive etch residue.

36. The method of claim 35, further wherein a portion of the second electrode layer is also removed with exposure of the capacitor structure to the dilute aqueous composition.

37. The method of claim 36, wherein removing the portion of the second electrode layer is performed at a rate in a range of about 4 Å/minute to about 2 Å/minute.

38. The method of claim 35, wherein the dilute aqueous composition includes a ratio of $H_2O:H_2O_2:HCl$ in a range of about 100:1:0.5 to about 100:10:5.

39. The method of claim 38, wherein the dilute aqueous composition includes a ratio of $H_2O:H_2O_2:HCl$ of about 100:2:1.

40. The method of claim 39, wherein the exposing step includes exposing the capacitor structure to the dilute aqueous composition at a temperature in the range of about room temperature to about 75 degrees Celsius.

41. A cleaning method in a semiconductor fabrication process, the method comprising:

providing a stack including at least a layer of $Ta_2O_5$ and a layer of conductive material, wherein the stack includes a conductive etch residue on at least portions thereof;

providing a dilute aqueous composition consisting essentially of a mineral acid, hydrogen peroxide ($H_2O_2$), and deionized water ($H_2O$), wherein the dilute aqueous composition includes a ratio of $H_2O:H_2O_2$:mineral acid in a range of about 100:1:0.5 to about 100:10:5; and exposing the stack to the dilute aqueous composition to remove the conductive etch residue.

42. The method of claim 41, wherein the mineral acid is hydrochloric acid (HCl).

43. The method of claim 42, wherein providing the stack includes:

providing a first conductive layer;

providing a second conductive layer;

providing a layer of $Ta_2O_5$ between the first and second conductive layers; and etching the first conductive layer, the second conductive layer and the layer of $Ta_2O_5$ to form the stack with the conductive etch residue resulting on at least portions thereof.

44. The method of claim 43, wherein providing the first conductive layer includes providing a layer of at least platinum and providing the second conductive layer includes providing a layer of at least one of a metal nitride and a metal silicide.

45. The method of claim 44, wherein providing the second conductive layer includes providing a layer of at least titanium nitride.

* * * * *